United States Patent
Hsu et al.

(10) Patent No.: US 7,592,891 B2
(45) Date of Patent: Sep. 22, 2009

(54) PLANAR SPIRAL INDUCTOR STRUCTURE HAVING ENHANCED Q VALUE

(75) Inventors: Hun-Ming Hsu, Tai-Chung (TW); Yen-Shih Ho, Hsin-Chu (TW)

(73) Assignee: Taiwan Semiconductor Manufacturing Co., Ltd., Hsin, Chu (TW)

( * ) Notice: Subject to any disclaimer, the term of this patent is extended or adjusted under 35 U.S.C. 154(b) by 54 days.

(21) Appl. No.: 12/079,059

(22) Filed: Mar. 24, 2008

(65) Prior Publication Data
US 2008/0174398 A1    Jul. 24, 2008

Related U.S. Application Data

(62) Division of application No. 09/588,788, filed on Jun. 6, 2000, now Pat. No. 7,370,403.

(51) Int. Cl.
*H01F 5/00* (2006.01)
(52) U.S. Cl. ..................................................... 336/200
(58) Field of Classification Search .................. 336/65, 336/83, 200, 206–208, 232
See application file for complete search history.

(56) References Cited

U.S. PATENT DOCUMENTS 4,016,519 A * 4/1977 Haas .......................... 336/200
5,070,317 A * 12/1991 Bhagat ........................ 336/200

* cited by examiner

*Primary Examiner*—Tuyen T. Nguyen
(74) *Attorney, Agent, or Firm*—Tung & Associates

(57) ABSTRACT

Within a method for fabricating an inductor structure there is first provided a substrate. There is then formed over the substrate a planar spiral conductor layer to form a planar spiral inductor, wherein a successive series of spirals within the planar spiral conductor layer is formed with a variation in at least one of: (1) a series of linewidths of the successive series of spirals; and (2) a series of spacings of the successive series of spirals. The method contemplates a planar spiral inductor structure fabricated in accord with the method. A planar spiral inductor structure fabricated in accord with the method is characterized by an enhanced Q value of the planar spiral inductor structure.

15 Claims, 1 Drawing Sheet

PLANAR SPIRAL INDUCTOR STRUCTURE HAVING ENHANCED Q VALUE

This application is a Divisional of U.S. patent application Ser. No. 09/588,788, filed Jun. 6, 2000 now U.S. Pat. No. 7,370,403.

BACKGROUND OF THE INVENTION

1. Field of the Invention

The present invention relates generally to inductor structures employed within microelectronic fabrications. More particularly, the present invention relates to planar spiral inductor structures employed within microelectronic fabrications.

2. Description of the Related Art

Microelectronic fabrications are fabricated from microelectronic substrates over which are formed patterned microelectronic conductor layers which are separated by microelectronic dielectric layers.

As microelectronic fabrication integration levels and functionality levels have increased, it has become common in the art of microelectronic fabrication to employ in addition to the generally conventional microelectronic device structures such as but not limited to transistor structures, resistor structures, diode structures and capacitor structures when fabricating microelectronic fabrications, less conventional microelectronic device structures such as inductor structures when fabricating microelectronic fabrications. In particular, within microelectronic fabrications which are intended to be employed within high frequency microelectronic fabrication applications, such as mobile communications high frequency microelectronic fabrication applications, it is often common to employ microelectronic inductor structures, in particular in conjunction with microelectronic capacitor structures, within those microelectronic fabrications.

While microelectronic inductor structures are thus desirable and often essential within the art of microelectronic fabrication, microelectronic inductor structures are nonetheless not entirely without problems in the art of microelectronic fabrication. In that regard, it is typically desirable in the art of microelectronic fabrication, but nonetheless not always readily achievable in the art of microelectronic fabrication, to fabricate microelectronic fabrications having formed therein microelectronic inductor structures with optimal properties, as characterized by enhanced Q values of the microelectronic inductor structures.

It is thus towards the goal of fabricating within microelectronic fabrications microelectronic inductor structures with optimal properties of the microelectronic inductor structures, as characterized by enhanced Q values of the microelectronic inductor structures, that the present invention is directed.

Various microelectronic inductor structures having desirable properties, including but not limited to enhanced Q values, have been disclosed in the art of microelectronic fabrication.

For example, Ashby et al., in "High Q Inductors for Wireless Applications in a Complementary Silicon Bipolar Process," IEEE J. of Solid State Circuits, Vol. 31(1), January 1996, pp. 4-9, discloses a planar spiral inductor structure fabricated with a particularly enhanced Q value for use within a microelectronic fabrication. To realize the foregoing object, there is employed when fabricating the planar spiral inductor structure a substrate of higher substrate resistance and a spirally patterned conductor layer of lower series resistance.

In addition, Kitahara, in U.S. Pat. No. 5,977,845 discloses a microelectronic inductor structure in conjunction with a microelectronic capacitor structure for use within a microelectronic fabrication, where there is avoided within the microelectronic inductor structure in conjunction with the microelectronic capacitor structure for use within the microelectronic fabrication a magnetic field effect upon the microelectronic capacitor structure as induced by the microelectronic inductor structure within the microelectronic fabrication. To realize the foregoing object, the microelectronic inductor structure comprises a pair of spiral inductor structures disposed geometrically with respect to the microelectronic capacitor structure such that a pair of magnetic fields generated by the pair of spiral inductor structures is equivalent, anti-parallel and cancels with respect to the microelectronic capacitor structure.

Finally, Yamazaki et al., in U.S. Pat. No. 6,002,161, also discloses a planar spiral inductor structure fabricated with an enhanced Q value for use within a microelectronic fabrication. To realize the foregoing object, there is decreased when fabricating the planar spiral inductor structure a series resistance of a spirally patterned conductor layer employed within the planar spiral inductor structure by employing within various portions of the spirally patterned conductor layer employed within the planar spiral inductor structure an additional laminated conductor layer which is insularly configured with respect to the spirally patterned conductor layer.

The teachings of the foregoing disclosures are incorporated herein fully by reference.

Desirable in the art of microelectronic fabrication are additional methods and materials which may be employed for fabricating within microelectronic fabrications microelectronic inductor structures with optimal properties, as characterized by enhanced Q values of the microelectronic inductor structures.

It is towards the foregoing object that the present invention is directed.

SUMMARY OF THE INVENTION

A first object of the present invention is to provide a method for fabricating a microelectronic inductor structure within a microelectronic fabrication, as well as the microelectronic inductor structure fabricated within the microelectronic fabrication while employing the method.

A second object of the present invention is to provide a method and a microelectronic inductor structure in accord with the first object of the invention, wherein the microelectronic inductor structure is fabricated with optimal properties, as characterized by an enhanced Q value of the microelectronic inductor structure.

A third object of the present invention is to provide a method in accord with the first object of the present invention or the second object of the present invention, which method is readily commercially implemented.

In accord with the objects of the present invention, there is provided by the present invention a method for fabricating a microelectronic inductor structure within a microelectronic fabrication, as well as the microelectronic inductor structure which is fabricated within the microelectronic fabrication while employing the method.

To practice the method of the present invention, there is first provided a substrate. There is then formed over the substrate a planar spiral conductor layer to form a planar spiral inductor, wherein a successive series of spirals within the planar spiral conductor layer is formed with a variation in at least one of: (1) a series of linewidths of the successive series of spirals; and (2) a series of spacings separating the successive series of spirals.

The method of the present invention contemplates a planar spiral inductor structure fabricated in accord with the method of the present invention.

The present invention provides a method for fabricating a microelectronic inductor structure within a microelectronic fabrication, as well as the microelectronic inductor structure fabricated within the microelectronic fabrication while employing the method, wherein the microelectronic inductor structure is fabricated with optimal properties, as characterized by an enhanced Q value of the microelectronic inductor structure. The present invention realizes the foregoing object by employing when fabricating a planar spiral inductor structure in accord with the present invention a spirally patterned conductor layer employed for forming the planar spiral inductor, where a successive series of spirals within the spirally patterned conductor layer is formed with a variation in at least one of: (1) a series of linewidths of the successive series of spirals; and (2) a series of spacings separating the successive series of spirals.

The method of the present invention is readily commercially implemented. As will become clear within the context of the Description of the Preferred Embodiment which follows, a microelectronic inductor structure fabricated in accord with the present invention may be fabricated employing methods and materials as are otherwise generally conventional in the art of microelectronic fabrication. Since it is largely structural features of a microelectronic inductor structure in accord with the present invention which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for fabricating a microelectronic inductor structure within a microelectronic fabrication, as well as the microelectronic inductor structure fabricated within the microelectronic fabrication while employing the method, wherein the microelectronic inductor structure is fabricated with optimal properties, as characterized by an enhanced Q value of the microelectronic inductor structure. The present invention realizes the foregoing object by employing when fabricating a planar spiral inductor structure in accord with the present invention a spirally patterned conductor layer which comprises a successive series of spirals, and where the planar spiral conductor layer is formed with a variation of at least one of: (1) a series of linewidths of the successive series of spirals; and (2) a series of spacings which separate the successive series of spirals, within the spirally patterned conductor layer.

Although a microelectronic inductor structure fabricated in accord with the present invention provides particular value when fabricating an integrated circuit microelectronic fabrication which may be employed for higher frequency microelectronic fabrication applications, such as but not limited to wireless communications higher frequency microelectronic fabrication applications, a microelectronic inductor structure in accord with the present invention may be fabricated within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications, as employed within microelectronic fabrication applications including but not limited to higher frequency (i.e., greater than about 900 MHZ microelectronic fabrication applications, mid range frequency (i.e., from about 100 MHZ to about 900 MHz microelectronic fabrication applications and lower frequency (i.e., less than about 100 MHZ) microelectronic fabrication applications.

Figure 1:
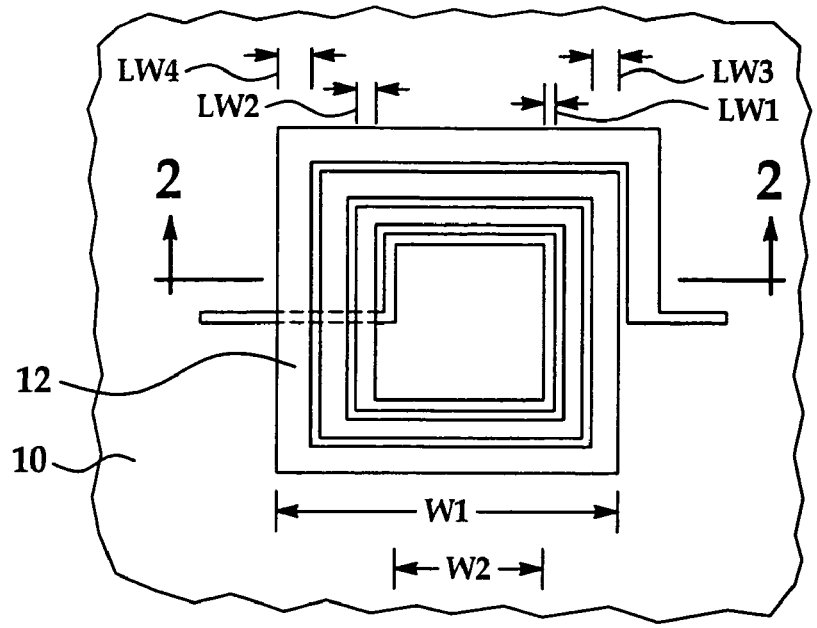
FIG. 1 shows a schematic plan view diagram of a microelectronic inductor structure fabricated in accord with the present invention.

Referring now to FIG. 1 there is shown a schematic plan view diagram of a microelectronic inductor structure fabricated in accord with a preferred embodiment of the present invention.

Shown in FIG. 1 is a substrate 10 having formed thereupon a spirally patterned conductor layer 12, where the spirally patterned conductor layer 12 has a series of spirals which is formed with a variation of linewidths within the series of spirals within the spirally patterned conductor layer 12. Within the schematic plan view diagram of FIG. 1, the spirally patterned conductor layer 12 forms a planar spiral inductor structure in accord with the present invention. As will be illustrated more particularly within the context of the examples which follow, by employing when forming the spirally patterned conductor layer 12 the series of spirals with the variation in linewidths, there is provided within the context of the present invention a planar spiral inductor structure with optimal properties, as characterized by an enhanced Q value of the planar spiral inductor structure.

As is illustrated within the schematic plan-view diagram of FIG. 1, a microelectronic inductor structure of the present invention which is formed as the planar spiral inductor structure of the present invention is formed of a bidirectional outer spiral width W1 of from about 250 to about 400 microns which defines an outer periphery of the planar spiral inductor structure, while similarly having a bidirectional inner spiral width W2 of from about 30 to about 120 microns which defines an inner cavity within the center of the planar spiral inductor structure of the present invention. As is illustrated within the schematic plan view diagram of FIG. 1, when forming a series of spirals within the preferred embodiment of the planar spiral inductor structure of the present invention, a linewidth of each of the spirals which comprises the series of spirals within the spirally patterned conductor layer 12 which forms the planar spiral inductor structure of the present invention becomes progressively wider as the series of spirals progress from the innermost spiral to the outermost spiral. Typically and preferably, the linewidth progresses from: (1) a most narrow linewidth LW1 of from about 7 to about 10 microns for an innermost spiral, to; (2) a less narrow linewidth LW2 of from about 10 to about 13 microns for a more inner interior spiral, to; (3) a still less narrow linewidth LW3 of from about 13 to about 17 microns for a more outer interior spiral, to; (4) a widest linewidth LW4 of from about 17 to about 21 microns for an outermost spiral.

Although the preferred embodiment and examples of the present invention illustrate the present invention within the context of a progressive and discontinuous variation of linewidth within a series of spirals within a planar spiral inductor structure in accord with the present invention, in a more broad sense, the present invention seeks to enhance electrical and electromagnetic properties of planar spiral inductor structures employed within microelectronic fabrications, and in particular to provide optimal properties within a planar spiral inductor structure as characterized by an enhanced Q value within the planar spiral inductor structure, by adjusting by means of variations including but not limited to continuous variations and discontinuous variations at least one of: (1) a series linewidths of a successive series of spirals; and (2) a series of spacings separating the successive series of spirals, within a spirally patterned conductor layer within a planar spiral inductor structure when fabricating the planar spiral inductor structure in accord with the present invention. Thus, the present invention is not strictly limited to the particular linewidths variation within a successive series of spirals within a spirally patterned conductor layer when fabricating a planar spiral inductor structure as is illustrated within the preferred embodiment of the present invention or the examples of the present invention. Rather, the present invention may also include alternative linewidths variation and/or spacings variation within a series of spirals within a spirally patterned conductor layer within a planar spiral inductor structure which effect similar and related results to those as disclosed within the preferred embodiment and examples of the present invention. Such specific and alternative linewidths variation and spacings variation which provide optimal performance of a planar spiral inductor structure in accord with the present invention are not believed to require undue experimentation for their discovery, insofar as a planar spiral inductor structure is a comparatively simple microelectronic device structure which is typically fabricated while employing a single etch mask layer which may be employed for forming a series of spirals within a spirally patterned conductor layer within the planar spiral inductor structure.

Similarly, although the schematic plan view diagram of FIG. 1 illustrates the planar spiral inductor structure of the present invention as being formed employing three and one half full spirals in a nominally rectangular geometry for the planar spiral inductor structure of the preferred embodiment of the present invention, planar spiral inductor structures in accord with the present invention may be formed employing geometries including but not limited to triangular geometries, square geometries, rectangular geometries, higher order polygonal geometries, uniform elliptical geometries, non-uniform elliptical geometries and circular geometries having a number of spirals ranging from about 2 to about 8.

Figure 2:
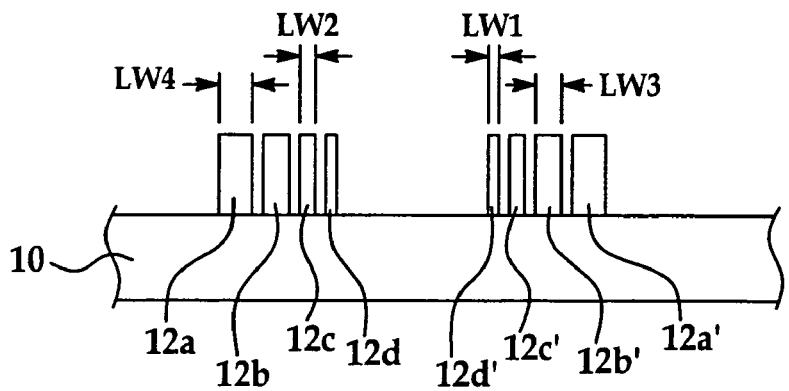
FIG. 2 shows a schematic cross-sectional diagram of a microelectronic inductor structure corresponding with the microelectronic inductor structure whose schematic plan view diagram is illustrated in FIG. 1.

Referring now to FIG. 2, there is shown a schematic cross-sectional diagram of a microelectronic inductor structure corresponding with the microelectronic inductor structure whose schematic plan view diagram is illustrated in FIG. 1.

Similarly within microelectronic inductor structure whose schematic plan view diagram is illustrated in FIG. 1, there is shown within the microelectronic inductor structure whose schematic cross-sectional diagram is illustrated in FIG. 2 the substrate 10 having formed thereupon a series of spirally patterned conductor layers 12*a*, 12*b*, 12*c*, 12*d*, 12*d'*, 12*c'*, 12*b'* and 12*a'* which derive from the spirally patterned conductor layer 12 as illustrated within the schematic plan view diagram of FIG. 1, and where the linewidths LW1, LW2, LW3 and LW4 of the series of spirally patterned conductor layers 12*a*, 12*b*, 12*c*, 12*d*, 12*d'*, 12*c'*, 12*b'* and 12*a'* correspond with the linewidths LW1, LW2, LW3 and LW4 of the spirally patterned conductor layer 12 as illustrated within the schematic plan view diagram of FIG. 1.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications, although, as noted above, a planar spiral inductor structure in accord with the present invention is most likely to provide value when fabricating an integrated circuit microelectronic fabrication which is employed within a higher frequency microelectronic fabrication application, such as a wireless communication higher frequency microelectronic fabrication application.

Although not specifically illustrated in the schematic cross-sectional diagram of FIG. 2, the substrate 10 may consist of a substrate alone as employed within the microelectronic fabrication, or in an alternative, the substrate 10 may comprise the substrate as employed within the microelectronic fabrication, where the substrate has formed thereupon and/or thereover any of several additional microelectronic layers as are conventionally employed within the microelectronic fabrication within which is employed the substrate 10. Similarly with the substrate alone as employed within the microelectronic fabrication, such additional microelectronic layers may be formed of microelectronic materials including but not limited to microelectronic conductor materials, microelectronic semiconductor materials and microelectronic dielectric materials.

Similarly, although also not specifically illustrated within the schematic cross-sectional diagram of FIG. 2, the substrate 10, typically and preferably, but not exclusively, when the substrate 10 consists of or comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to, transistors, resistors, diodes and capacitors.

Most preferably, although not exclusively, within the preferred embodiment of the present invention the substrate 10: (1) comprises a semiconductor substrate employed within a semiconductor integrated circuit microelectronic fabrication; (2) the semiconductor substrate has formed therein and/or therupon microelectronic devices as are conventional within the semiconductor integrated circuit microelectronic fabrication within which is employed the semiconductor substrate; and (3) the top surface of the substrate 10 is formed of an integrated circuit microelectronic layer formed of a dielectric material.

Within the preferred embodiment of the present invention with respect to the series of spirally patterned conductor layers 12*a*, 12*b*, 12*c*, 12*d*, 12*d'*, 12*c'*, 12*b'* and 12*a'*, the series of spirally patterned conductor layers 12*a*, 12*b*, 12*c*, 12*d*, 12*d'*, 12*c'*, 12*b'* and 12*a'* may be formed from any of several conductor materials as are conventional in the art of microelectronic fabrication for forming inductor structures or conductor structures within microelectronic fabrications, such conductor materials being selected from the group including but not limited to: (1) non-magnetic metal and non-magnetic metal alloy (such as but not limited to aluminum, aluminum alloy, copper and copper alloy) conductor materials: (2) magnetic metal and magnetic metal alloy (such as permalloy and higher order alloys incorporating permalloy alloy) conductor materials; (3) doped polysilicon (having a dopant concentration greater than about 1 E18 dopant atoms per cubic centimeter) and polycide (doped polysilicon/metal silicide stack) conductor materials; and (4) laminates thereof. Typically and preferably, each of the spirally patterned conductor layers 12a, 12b, 12c, 12d, 12d', 12c', 12b', and 12a' is formed to a thickness of from about 4000 to about 35000 angstroms.

Upon forming the microelectronic fabrication whose schematic plan view diagram is illustrated in FIG. 1 and whose schematic cross-sectional diagram is illustrated in FIG. 2, there is formed a microelectronic fabrication having formed therein a microelectronic inductor structure with optimal properties, as characterized by an enhanced Q value of the microelectronic inductor structure. The present invention realizes the foregoing object by fabricating the microelectronic inductor structure of the present invention as a planar spiral inductor structure, wherein a series of spirals within the planar spiral inductor structure is formed with a variation in at least one of: (1) a series linewidths of the successive series of spirals; and (2) a series of spacings separating the successive series of spirals.

EXAMPLES

In order to illustrate the value of the present invention, there was fabricated as a first example a planar spiral inductor structure generally in accord with the planar spiral inductor structure whose schematic plan view diagram is illustrated in FIG. 1 and whose schematic cross-sectional diagram is illustrated in FIG. 2, but wherein there was employed a total of five spirals within the planar spiral inductor structure rather than the three and one half spirals within the planar spiral inductor structure whose schematic plan view diagram is illustrated in FIG. 1. The five spirals progressed from a most narrow linewidth spiral within the center of the planar spiral inductor structure to a most wide linewidth spiral at the periphery of the planar spiral inductor structure. The linewidths of the spirals progressed in the order of about 9 microns, to about 12 microns, to about 15 microns, to about 18 microns and finally to about 21 microns. Each of the spirals was separated by a spacing (i.e., pitch) dimension of about 1.5 microns. Similarly, an inner cavity of the planar spiral inductor structure was defined by a bidirectional cavity width of about 120 microns and an outer periphery of the planar spiral inductor structure was defined by a bidirectional linewidth of about 280 microns. Finally, each of the spirals within the planar spiral inductor structure was formed to a thickness of about 20000 angstroms from an aluminum alloy conductor material.

For comparison, purposes, there was also fabricated as a second example a more conventional planar spiral inductor structure otherwise generally equivalent with the planar spiral inductor structure fabricated in accord with the first example, but wherein each spiral within the series of five spirals had a linewidth of about 15 microns, rather than the variable linewidth as disclosed above.

Figure 3:
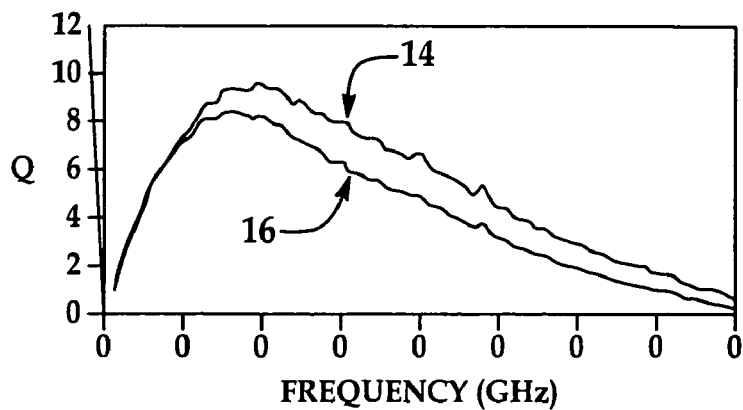
FIG. 3 shows a graph of Q versus Frequency for a microelectronic inductor structure fabricated in accord with the present invention, in comparison with an otherwise equivalent microelectronic inductor structure fabricated employing conventional linewidth and spacing dimensions.

Each of the two planar spiral inductor structures in accord with the examples was then electrically tested employing electrical testing methods as are conventional in the art of microelectronic fabrication. For both of the planar spiral inductor structures in accord with the examples, there was observed no discernable variation in a resonant frequency of about 8 Ghz. However, with respect to measurement of Q value as a function of frequency, it is seen, by reference of the graph of FIG. 3, that at frequencies of greater than about 1.5 gigahertz there is approximately a 20 percent increase in Q value for a planar spiral inductor structure fabricated in accord with the present invention and further in accord with the first example, as characterized by the curve corresponding with reference numeral 14, in comparison with a planar spiral inductor structure more conventionally fabricated in accord with the second example, as characterized by the curve corresponding with reference numeral 16. For reference purposes, specifics of calculation of Q values are provided within Yamazaki, U.S. Pat. No. 6,002,161, within the Description of the Related Art.

Thus, in accord with the examples of the present invention, it is clear that the present invention and the preferred embodiment of the present invention provide within a microelectronic fabrication a microelectronic inductor structure with optimal properties, as characterized by an enhanced Q value of the microelectronic inductor structure.

As is understood by a person skilled in the art, the preferred embodiment and examples of the present invention are illustrative of the present invention rather than limiting of the present invention. Revisions and modifications may be made to methods, materials, structures and dimensions through which is fabricated within a microelectronic fabrication in accord with the preferred embodiment of the present invention a microelectronic inductor structure while still fabricating a microelectronic fabrication having fabricated therein a microelectronic inductor structure in accord with the present invention, further in accord with the appended claims.

What is claimed is:

1. An integrated circuit inductor structure comprising:
a substrate comprising a dielectric layer over a semiconductor substrate;
a planar spiral conductor layer comprising a single spiral to form a planar spiral inductor, wherein a successive series of loops within the planar spiral conductor layer comprise a progressive and discontinuous variation, said variation progressing from a center of said spiral defined by a first loop to a periphery of said series of loops, said variation comprising at least one of:
a series of progressive stepwise changes in linewidths comprising a series of discrete linewidths for the successive series of loops; and
a series of progressive stepwise changes in spacings separating the successive series of loops;
wherein said center of said spiral defined by said first loop surrounds a planar surface of said dielectric layer to define an inner cavity.

2. The inductor structure of claim 1 wherein the successive series of loops comprises a shape selected from the group consisting of a triangle, a square, a rectangle, a higher order polygon, a uniform ellipse, a non-uniform ellipse and a circle.

3. The inductor structure of claim 1 wherein the planar spiral conductor layer comprises a conductor material selected from the group consisting of non-magnetic metal, non-magnetic metal alloy, magnetic metal, magnetic metal alloy, doped polysilicon and polycide conductor materials, and laminates thereof.

4. The inductor structure of claim 1 wherein wherein the progressive stepwise changes comprising a series of discrete linewidths increases from the first loop which defines the center of the planar spiral inductor having a comparatively narrow linewidth to a final loop which defines the perimeter of the planar spiral inductor having a comparatively wide linewidth.

5. The inductor structure of claim 4 wherein the comparatively narrow linewidth is from about 7 to about 10 microns and the comparatively wide line width is from about 17 to about 21 microns.

6. The inductor structure of claim 1 wherein the series of spirals comprises from about 1 to about 8 loops.

7. The inductor structure of claim 1 wherein the progressive and discontinuous variation comprises progressively increasing or decreasing stepwise changes.

8. An integrated circuit inductor structure comprising:
   a substrate comprising a dielectric layer over a semiconductor substrate;
   a planar spiral conductor layer comprising a single spiral to form a planar spiral inductor, wherein a successive series of loops within the planar spiral conductor layer comprise a progressive and discontinuous variation, said variation progressing from a center of said spiral defined by a first loop to a periphery of said series of loops, said variation comprising a series of progressive stepwise changes in linewidths comprising:
   a series of discrete linewidths for the successive series of loops;
   wherein said center of said spiral defined by said first loop surrounds a planar surface of said dielectric layer to define an inner cavity.

9. The inductor structure of claim 8 wherein said variation further comprises a series of progressive stepwise changes in spacings separating the successive series of loops.

10. The inductor structure of claim 8 wherein the successive series of loops comprises a shape selected from the group consisting of a triangle, a square, a rectangle, a higher order polygon, a uniform ellipse, a non-uniform ellipse and a circle.

11. The inductor structure of claim 8 wherein the progressive stepwise changes comprising a series of discrete linewidths increases from the first loop which defines the center of the planar spiral inductor having a comparatively narrow linewidth to a final loop which defines the perimeter of the planar spiral inductor having a comparatively wide linewidth.

12. The inductor structure of claim 8 wherein the progressive and discontinuous variation comprises progressively increasing or decreasing stepwise changes.

13. An integrated circuit inductor structure comprising:
   a substrate comprising a dielectric layer over a semiconductor substrate;
   a planar spiral conductor layer comprising a single spiral to form a planar spiral inductor, wherein a successive series of loops within the planar spiral conductor layer comprise a progressive and discontinuous variation, said variation progressing in any direction from a center of said spiral defined by a first loop to a periphery of said series of loops, said variation comprising:
   a series of progressive stepwise changes in spacings separating the successive series of loops;
   wherein said center of said spiral defined by said first loop surrounds a planar surface of said dielectric layer to define an inner cavity.

14. The inductor structure of claim 13 wherein said variation further comprises a series of progressive stepwise changes in linewidths comprising series of discrete linewidths for the successive series of loops.

15. The inductor structure of claim 14 wherein the progressive stepwise changes comprising a series of discrete linewidths increases from the first loop which defines the center of the planar spiral inductor having a comparatively narrow linewidth to a final loop which defines the perimeter of the planar spiral inductor having a comparatively wide linewidth.

\* \* \* \* \*